(12) United States Patent
Qi et al.

(10) Patent No.: US 9,324,689 B2
(45) Date of Patent: Apr. 26, 2016

(54) CHIP-ON-FILM (COF) TAPE AND CORRESPONDING COF BONDING METHOD

(71) Applicant: SHENZHEN CHINA STAR OPTOELECTRONICS TECHNOLOGY CO., LTD., Shenzhen (CN)

(72) Inventors: Minghu Qi, Shenzhen (CN); Chun Hao Wu, Shenzhen (CN); Kun Hsien Lin, Shenzhen (CN); Yongqiang Wang, Shenzhen (CN); Zhiyou Shu, Shenzhen (CN); Weibing Yang, Shenzhen (CN); Zenghong Chen, Shenzhen (CN); Guokun Yang, Shenzhen (CN); Chenyangzi Li, Shenzhen (CN); Yunshao Jiang, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 235 days.

(21) Appl. No.: 14/235,808

(22) PCT Filed: Nov. 27, 2013

(86) PCT No.: PCT/CN2013/087891
§ 371 (c)(1),
(2) Date: Jan. 29, 2014

(87) PCT Pub. No.: WO2015/074283
PCT Pub. Date: May 28, 2015

(65) Prior Publication Data
US 2015/0357308 A1    Dec. 10, 2015

(30) Foreign Application Priority Data
Nov. 21, 2013  (CN) .......................... 2013 1 0593774

(51) Int. Cl.
*H01L 23/00*  (2006.01)
*H01L 25/065*  (2006.01)
(Continued)

(52) U.S. Cl.
CPC ........ *H01L 25/0655* (2013.01); *G02F 1/13306* (2013.01); *G02F 1/13454* (2013.01);
(Continued)

(58) Field of Classification Search
CPC .... H01L 24/50; H01L 24/94; G02F 1/133308
USPC .......... 257/668, 671, 782; 438/110, 111, 118, 438/123, 125
See application file for complete search history.

(56) References Cited

U.S. PATENT DOCUMENTS

2004/0256702 A1* 12/2004 Iwane ............... H01L 23/49572
257/668
2006/0198054 A1* 9/2006 You ..................... H01L 21/4846
360/133

(Continued)

FOREIGN PATENT DOCUMENTS

CN          1603891 A     4/2005
CN        101483169 A     7/2009
(Continued)

*Primary Examiner* — S. V. Clark
(74) *Attorney, Agent, or Firm* — Mark M. Friedman

(57) ABSTRACT

The present invention provides a chip-on-film (COF) tape and a corresponding COF bonding method. The COF tape comprises a base tape, a plurality of first COFs and second COFs, the first and second COFs are arranged on the base tape in an alternating manner, and are correspondingly punched onto a moving platform by a punching mechanism, and are respectively bonded onto two side edges of a liquid crystal panel. The present invention can simultaneously process the bonding operations of the two types of COF by using only one COF tape and one set of equipment, thus lowering the cost and increasing the productivity.

10 Claims, 8 Drawing Sheets

(51) Int. Cl.
*G02F 1/133* (2006.01)
*H01L 23/538* (2006.01)
*G02F 1/1345* (2006.01)
*H01L 23/498* (2006.01)
*G02F 1/13* (2006.01)

(52) U.S. Cl.
CPC ........ *H01L23/4985* (2013.01); *H01L 23/5387* (2013.01); *H01L 24/75* (2013.01); *G02F 1/1303* (2013.01); *H01L 24/32* (2013.01); *H01L 24/83* (2013.01); *H01L 2224/32225* (2013.01); *H01L 2224/7598* (2013.01); *H01L 2224/75301* (2013.01); *H01L 2224/83203* (2013.01); *H01L 2224/83851* (2013.01); *H01L 2224/97* (2013.01); *Y10T 156/1052* (2015.01)

(56) References Cited

U.S. PATENT DOCUMENTS

| | | | | |
|---|---|---|---|---|
| 2009/0115034 | A1* | 5/2009 | Takahashi | H01L 23/4985 257/668 |
| 2012/0112330 | A1* | 5/2012 | Liao | H01L 23/4985 257/668 |
| 2013/0100615 | A1* | 4/2013 | Lin | H01L 23/4985 361/729 |

FOREIGN PATENT DOCUMENTS

| | | |
|---|---|---|
| CN | 101685205 A | 3/2010 |
| CN | 102253513 A | 11/2011 |
| CN | 102455530 A | 5/2012 |
| KR | 20080100761 A | 11/2008 |

* cited by examiner

CHIP-ON-FILM (COF) TAPE AND CORRESPONDING COF BONDING METHOD

FIELD OF THE INVENTION

The present invention relates to a chip-on-film (COF) tape, and more particularly to a composite packaged COF tape and a corresponding COF bonding method.

BACKGROUND OF THE INVENTION

A liquid crystal display (LCD) is a type of flat panel display (FPD) which displays images by the properties of the liquid crystal material. In comparison with other display devices, the LCD has the advantages of being lightweight, compact, having a low driving voltage, and having low power consumption and thus has already become the mainstream product in the consumer market. In the traditional manufacturing process of an LCD panel, it comprises a front-end array process, a mid-end cell process, and a back-end modulation process. The front-end array process is used to produce thin-film transistor (TFT) substrates (also called array substrates) and color filter (CF) substrates; the mid-end cell process is used to combine the TFT substrate with the CF substrate, then fill liquid crystal into a space therebetween, and then they are cut to form panels compatible with a suitable product size; and the back-end modulation process is used to execute an installation process on the combined panel, a backlight module, a panel driver circuit, an outer frame, etc.

As mentioned above, LCD driver chips are important components of the LCD, and the main function thereof is to output the needed voltage to pixels, so as to control the twist degree of the liquid crystal molecules. There are two types of LCD driver chips: one is the source driver chip arranged on the X-axis, the other is the gate driver chip arranged on the Y-axis. In other words, the source driver chips control image signals, and the gate driver chips control gate switch signals, so they have different functions for the LCD panel. Simply speaking, images of an LCD are formed by scanning lines one by one. The gate driver chip controls the vertical signals. If the scanning is started from the topmost line, the first pin of the gate driver chip is set to be switched on, and the others are set to be switched off. The signals in the source driver chip are the real signal (horizontal), and the sent signal is only accepted by the horizontal pixels of the first line. After the signal of the first line is transmitted, the second line will be the next one, while the content of the source driver chip is changed to the second line, and the second pin of the gate driver chip is switched on, and the others are switched off, so that the data is transmitted to the second line.

Furthermore, the assembly of the driver chips of the back-end modulation process is an assembling technology which combines the packaged source driver chips and the packaged gate driver chip with the LCD panel. There are various packaging types of the driver chip for an LCD, such as quad flat package (QFP), chip on glass (COG), tape automated bonding (TAB), chip on film (COF), etc. The COF structure has flexibility and smaller circuit pitches, so has become the mainstream technology of the package of driver chips.

Usually, a tape-packaged COF is processed by rolling and delivering in whole the tape, and in the traditional manufacture of an LCD panel, it is necessary to provide the above-mentioned COFs bonded to two edges thereof. Referring now to FIGS. 1A, 1B and 2, a top view of a traditional source COF tape is illustrated in FIG. 1A; a top view of a traditional gate COF tape is illustrated in FIG. 1B; and FIG. 2 is a schematic top view showing that the traditional source and gate COFs are bonded on a liquid crystal panel. Specially explaining, for conveniently describing, the above-mentioned figures are shown in simplification, wherein the number of traces is simplified, and some details which are unrelated to the explanation are also omitted.

As shown in FIG. 1A, a source COF tape 80 mainly comprises a base tape 80a and a plurality of source COFs 81, wherein the source COFs 81 are arranged on the base tape 80a, and by a plurality of punching processes the needed source COFs 81 can be cut from the base tape 80a of the source COF tape 80.

As shown in FIG. 1B, a gate COF tape 90 mainly comprises a base tape 90a and a plurality of gate COFs 91, wherein the gate COFs 91 are arranged on the base tape 90a, and by a plurality of punching processes the needed gate COFs 91 can be cut from the base tape 90a of the gate COF tape 90.

Moreover, as shown in FIG. 2, a liquid crystal panel 100 has a first side edge 110 and a second side edge 120 which are perpendicular to each other. By a plurality of processes of thermo-compression bonding the source COFs 81 can be bonded to the first side edge 110 of the liquid crystal panel 100, and the gate COFs 91 can be bonded to the second side edge 120 of the liquid crystal panel 100, so as to accomplish the assembly operation of the driver chips of the liquid crystal panel 100.

As described above, because the trend in developing LCD panels tends towards increasing the size of the panels, and the request for productivity is higher and higher, bonding two edges of an LCD at the same time has become a newly developing trend. However, it is necessary to provide both the above-mentioned source COFs 81 and the gate COFs 91. If the two different types of COF need to be provided simultaneously, it is necessary to prepare two sets of independent operating equipment, thus increasing the cost of the equipment.

As a result, it is necessary to provide a COF tape and a corresponding COF bonding method to solve the problems existing in the conventional technology.

SUMMARY OF THE INVENTION

The present invention provides a composite packaged chip-on-film (COF) tape and a corresponding COF bonding method, which can solve the problems existing in the conventional technology: that the bonding operation of two types of COF can not be processed with a single tape and equipment at the same time.

To achieve the above object, the present invention provides a COF tape, which comprises: a base tape; a plurality of first COFs; and a plurality of second COFs; wherein the first COFs and the second COFs are arranged on the base tape.

In one embodiment of the present invention, in a cycle section of the COF tape, the number of the first COFs and the second COFs is corresponding to the number of the first COFs and the second COFs needed on a liquid crystal panel.

In one embodiment of the present invention, in the cycle section, the number of the first COFs is n+m, and the number of the second COFs is n.

In one embodiment of the present invention, in the cycle section, n of the first COFs and n of the second COFs are arranged in alternation firstly, and then m of the first COFs are arranged thereafter.

To achieve the above object, the present invention provides a COF bonding method, which comprises steps of:
providing a COF tape comprising a base tape, a plurality of first COFs and a plurality of second COFs, wherein the first COFs and the second COFs are arranged on the base tape, and then a part of the COF tape is pulled out;

providing a punching mechanism and a moving platform, wherein the punching mechanism comprises a first punching head and a second punching head which are disposed above the COF tape, and the moving platform is disposed under the corresponding COF tape, and the first punching head punches the corresponding first COFs onto the moving platform and/or the second punching head punches the corresponding second COFs onto the moving platform;

moving the moving platform out to a certain position;

providing a liquid crystal panel having a first side edge and a second side edge perpendicular to each other; and providing a first bonding head and a second bonding head, wherein the first bonding head picks up the corresponding first COFs on the moving platform to bond onto the corresponding first side edge of the liquid crystal panel, and/or the second bonding head picks up the corresponding second COFs on the moving platform to bond onto the corresponding second side edge of the liquid crystal panel.

In one embodiment of the present invention, the steps of punching and bonding are repeated, so as to accomplish bonding operations of all of the first COFs and the second COFs of the liquid crystal panel.

In one embodiment of the present invention, in a cycle section of the COF tape, the number of the first COFs and the second COFs is correspond to the number of the first COFs and the second COFs needed on a liquid crystal panel.

In one embodiment of the present invention, in the cycle section, the number of the first COFs is n+m, and the number of the second COFs is n; and wherein n of the first COFs and n of the second COFs are arranged in alternation firstly, and then m of the first COFs are arranged thereafter.

In one embodiment of the present invention, according to an arranged situation of the first COFs and the second COFs on the COF tape, the first punching head and the second punching head can actuate alone or together, so as to punch the first COFs and/or the second COFs onto the moving platform.

In one embodiment of the present invention, according to a placed situation in which the first COFs and the second COFs are placed on the moving platform, the first bonding head and the second bonding head can actuate alone or together, so as to bond the first COFs and/or the second COFs onto the liquid crystal panel.

To achieve the above object, the present invention provides a COF bonding method, which comprises steps of:

providing a COF tape comprising a base tape, a plurality of first COFs and a plurality of second COFs, wherein the first COFs and the second COFs are arranged on the base tape, and in a cycle section of the COF tape, the number of the first COFs is n+m, and the number of the second COFs is n; and wherein n of the first COFs and n of the second COFs are arranged in alternation firstly, and then m of the first COFs are arranged thereafter; and then the part of that n of the first COFs and n of the second COFs which are arranged on the COF tape is pulled out;

providing a punching mechanism and a moving platform, wherein the punching mechanism comprises a first punching head and a second punching head which are disposed above the COF tape, and the moving platform is disposed under the corresponding COF tape, and the first punching head punches the corresponding first COFs onto the moving platform and the second punching head punches the corresponding second COFs onto the moving platform;

moving the moving platform out to a certain position;

providing a liquid crystal panel having a first side edge and a second side edge perpendicular to each other; and providing a first bonding head and a second bonding head, wherein the first bonding head picks up the corresponding first COFs on the moving platform to bond onto the corresponding first side edge of the liquid crystal panel, and the second bonding head picks up the corresponding second COFs on the moving platform to bond onto the corresponding second side edge of the liquid crystal panel.

In one embodiment of the present invention, the foregoing steps are repeated, so as to accomplish bonding operations of the part of that n of the first COFs and n of the second COFs which are arranged on the COF tape.

In one embodiment of the present invention, after the foregoing steps, it further comprises the following steps of:

pulling out the part of the COF tape that m of the first COFs are arranged on;

punching the corresponding first COFs onto the moving platform by the first punching head;

moving the moving platform out to a certain position;

picking up the corresponding first COFs on the moving platform by the first bonding head to bond onto the corresponding first side edge of the liquid crystal panel.

In one embodiment of the present invention, the foregoing steps are repeated, so as to accomplish bonding operations of the part of that m of the first COFs which are arranged on the COF tape.

Hence, the present invention provides a COF tape and a corresponding COF bonding method, wherein it can simultaneously process the bonding operations of the two types of COF by using only one COF tape and one set of equipment, so as to lower the cost and increase the productivity.

DETAILED DESCRIPTION OF THE PREFERRED EMBODIMENTS

The foregoing objects, features, and advantages adopted by the present invention can be best understood by referring to the following detailed description of the preferred embodiments and the accompanying drawings. Furthermore, the directional terms described in the present invention, such as upper, lower, front, rear, left, right, inner, outer, side, etc., are only directions referring to the accompanying drawings, so that the used directional terms are used to describe and understand the present invention, but the present invention is not limited thereto.

Figure 1A:
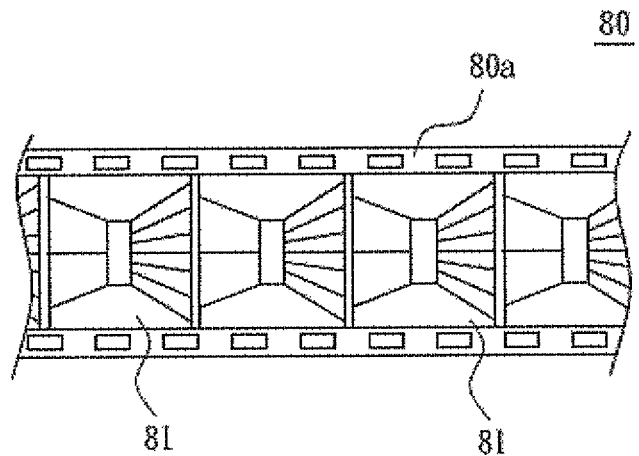
FIG. 1A is a top view of a traditional source chip-on-film (COF) tape.
Figure 1B:
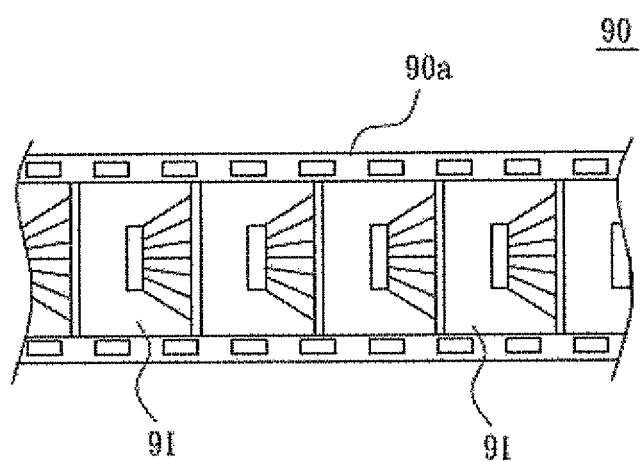
FIG. 1B is top view of a traditional gate COF tape.
Figure 2:
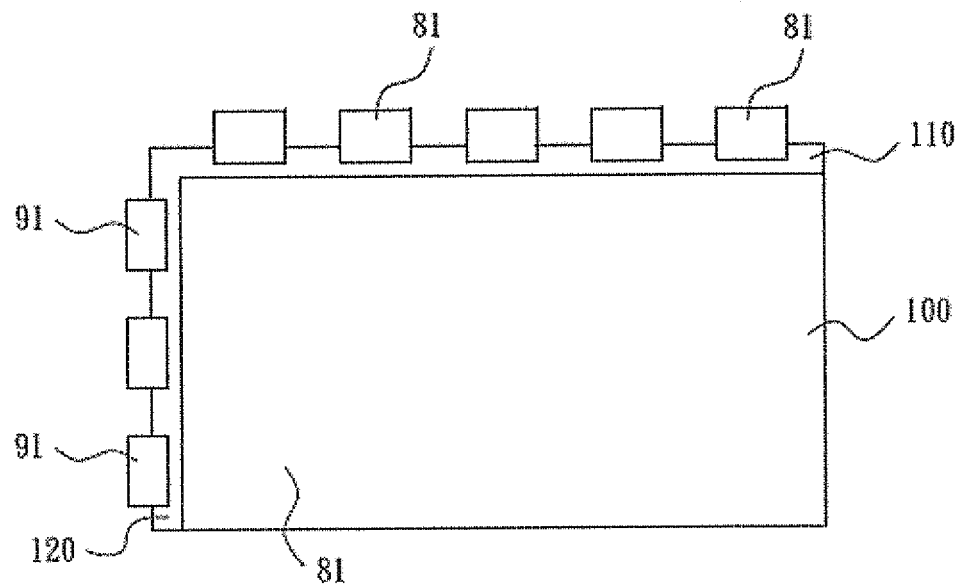
FIG. 2 is a schematic top view showing that the traditional source and gate COFs are bonded on a liquid crystal panel.
Figure 3:
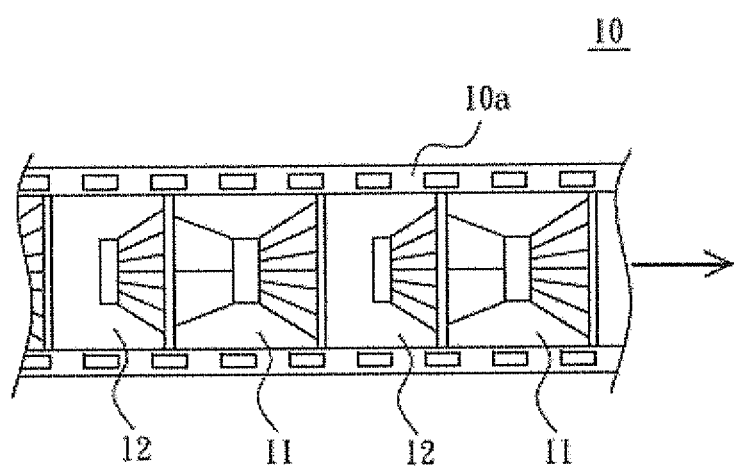
FIG. 3 is a top view of a composite packaged COF tape according to a first preferred embodiment of the present invention.

Referring now to FIG. 3, which is a top view of a composite packaged chip-on-film (COF) tape according to a first preferred embodiment of the present invention. Specially explaining, for conveniently describing, the figures of the present invention are shown in simplification, wherein the number of traces is simplified, and some details which are unrelated to the explanation are also omitted.

As shown in FIG. 3, a composite packaged COF tape 10 mainly comprises a base tape 10a, a plurality of first COFs 11, and a plurality of second COFs 12, wherein the first COFs 11 and the second COFs 12 are arranged on the base tape 10a in a certain rule. In the preferred embodiment, the first COFs 11 and the second COFs 12 are alternately arranged on the base tape 10a. Additionally, the pulled directions of the base tape 10a of the COF tape 10 are shown by arrows in the figures of the present invention.

In FIG. 3, the first COF 11 can be a COF of a source driver IC, and the interior structures thereof are shown in simplification, and are not labeled. The first COF 11 comprises a flexible substrate, a driver chip, a plurality of output-side traces, and a plurality of input-side traces. The flexible substrate of the first COF 11 is provided with an output edge and an input edge. The output edge is connected with a liquid crystal panel (not shown), and the input edge is the side edge opposite to the output edge, which is connected with a circuit board (not shown).

In addition, the second COF 12 can be a COF of a gate driver IC, and the interior structures thereof are shown in simplification, and are not labeled. The second COF 12 comprises a flexible substrate, a driver chip, and a plurality of output-side traces. The flexible substrate of the second COF 12 is provided with an output edge. The output edge is connected with the liquid crystal panel (not shown).

Referring now to FIGS. 4A-4H, which are schematic views showing the steps in which the COF tape 10 is bonded on a liquid crystal panel according to the first preferred embodiment of the present invention. A COF bonding operation of the present invention, for example, is provided with an anisotropic conductive film (ACF) between the output edge of the COFs 11, 12 and contacts of the edge of the liquid crystal panel, and then the contacts of the output edge are electronically connected to the contacts of the liquid crystal panel by heating and pressing on the output edge, so as to accomplish a bonding action with the liquid crystal panel. The above-mentioned bonding method is also called thermo-compression bonding. However, the method for assembling COF onto the liquid crystal panel is not limited in the present invention. Other methods for assembling COF onto the liquid crystal panel can be adopted in the present invention.

Figure 4A:
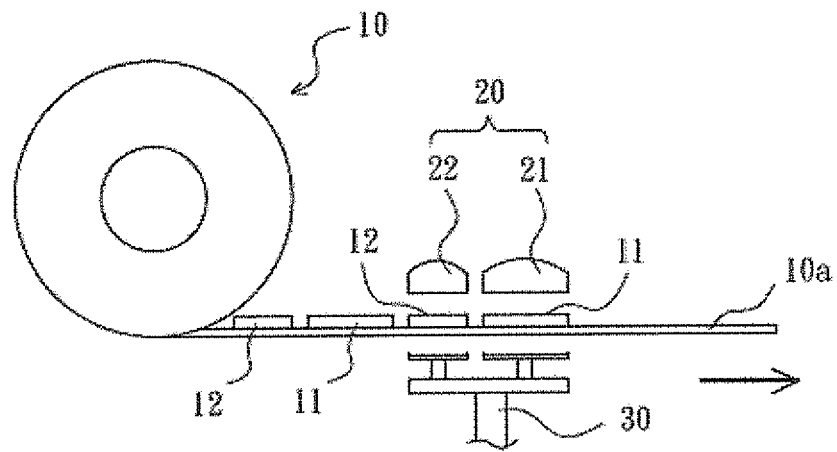
FIGS. 4A-4H are schematic views showing steps of that the COF tape is bonded on a liquid crystal panel according to the first preferred embodiment of the present invention.

The steps in which the COF tape 10 bonded onto a liquid crystal panel according to the first preferred embodiment of the present invention are described as follows:

Firstly, as shown in FIG. 4A, a COF tape 10 is provided, which comprises a base tape 10a, a plurality of first COFs 11, and a plurality of second COFs 12, wherein the first COFs 11 and the second COFs 12 are alternately arranged on the base tape 10a, and then part of the COF tape 10 is pulled out.

Figure 4B:
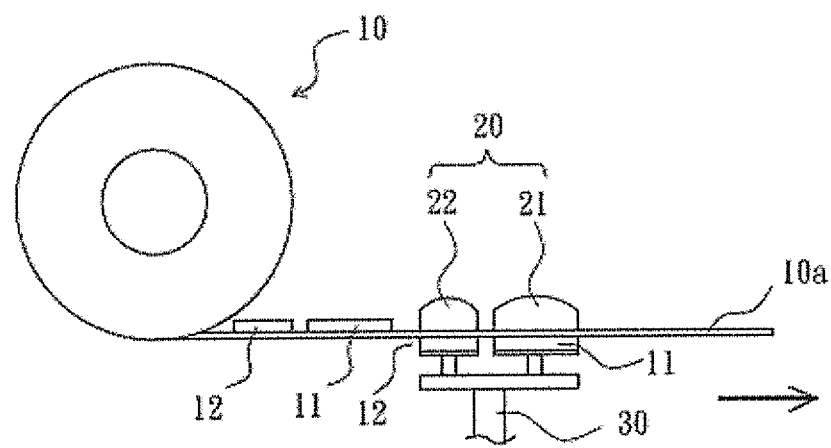

Then, as shown in FIGS. 4A and 4B, a punching mechanism 20 and a moving platform 30 are provided. The punching mechanism 20 comprises a first punching head 21 and a second punching head 22 which are disposed above the COF tape 10; and the moving platform 30 is correspondingly disposed under the COF tape 10. Then, as shown in FIG. 4B, the first punching head 21 punches the corresponding first COF 11 thereunder onto the moving platform 30, and the second punching head 22 punches the corresponding second COF 12 thereunder onto the moving platform 30 at the same time.

Figure 4C:
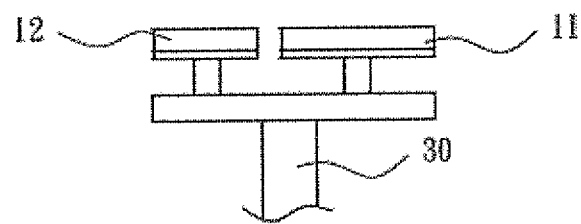
Figure 4D:
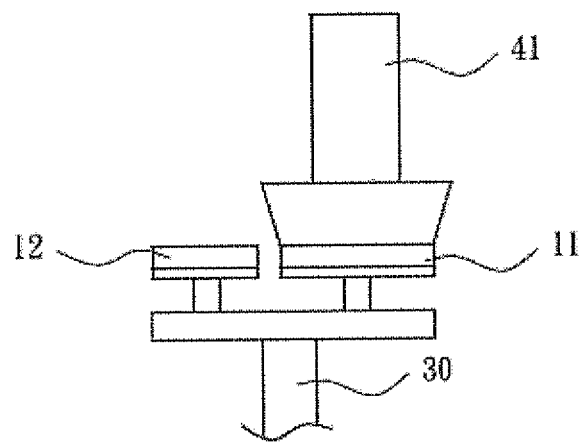
Figure 4E:
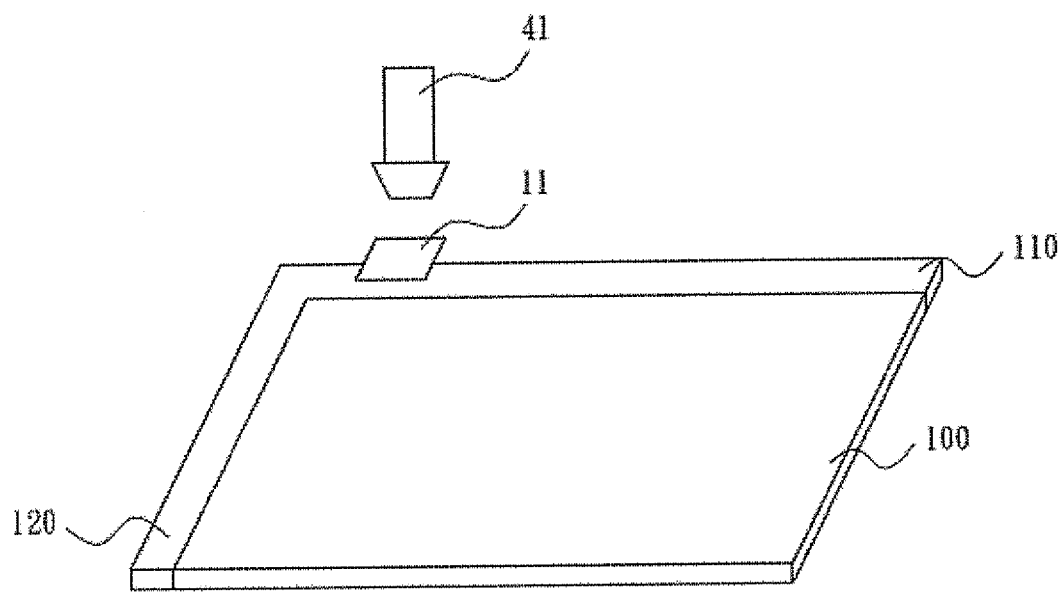
Figure 4F:
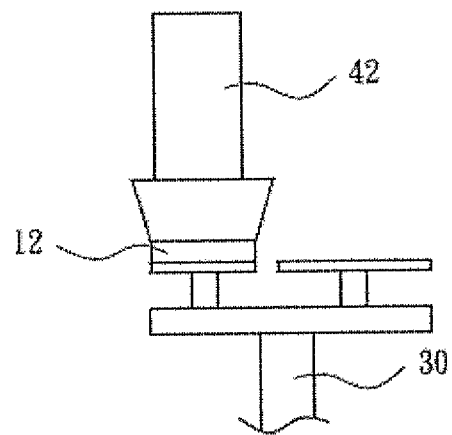
Figure 4G:
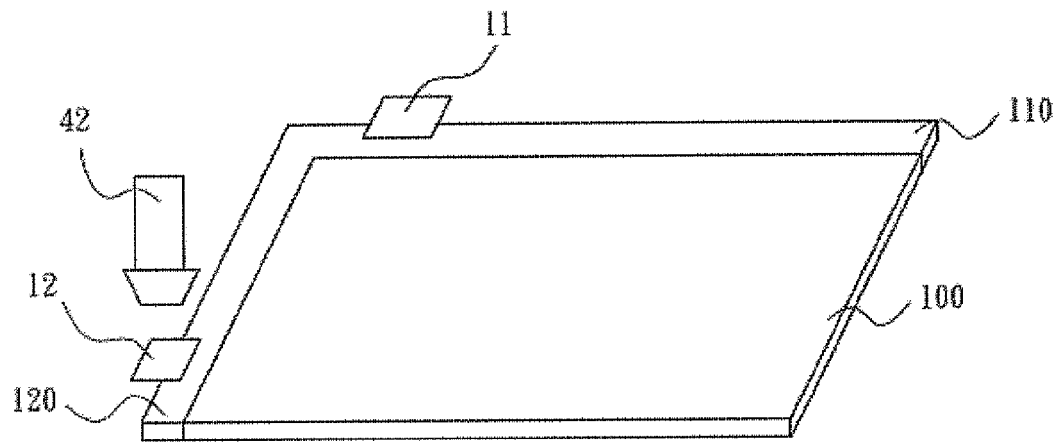

Then, as shown in FIG. 4C, the moving platform 30 is moved out to a certain position, which is preferably close to the next operating area. Then, as shown in FIGS. 4D and 4E, a liquid crystal panel 100 is provided. The liquid crystal panel 100 has a first side edge 110 and a second side edge 120 which are perpendicular to each other. Furthermore, a first bonding head 41 is provided. The first bonding head 41 picks up the corresponding first COF 11 on the moving platform 30 (as shown in FIG. 4D), and the first bonding head 41 bonds the corresponding first COF 11 onto the first side edge 110 of the liquid crystal panel 100 (as shown in FIG. 4E). Then, as shown in FIGS. 4F and 4G, a second bonding head 42 is provided. The second bonding head 42 picks up the corresponding second COF 12 on the moving platform 30 (as shown in FIG. 4F), and the second bonding head 42 bonds the corresponding second COF 12 onto the second side edge 120 of the liquid crystal panel 100 (as shown in FIG. 4G).

Figure 4H:
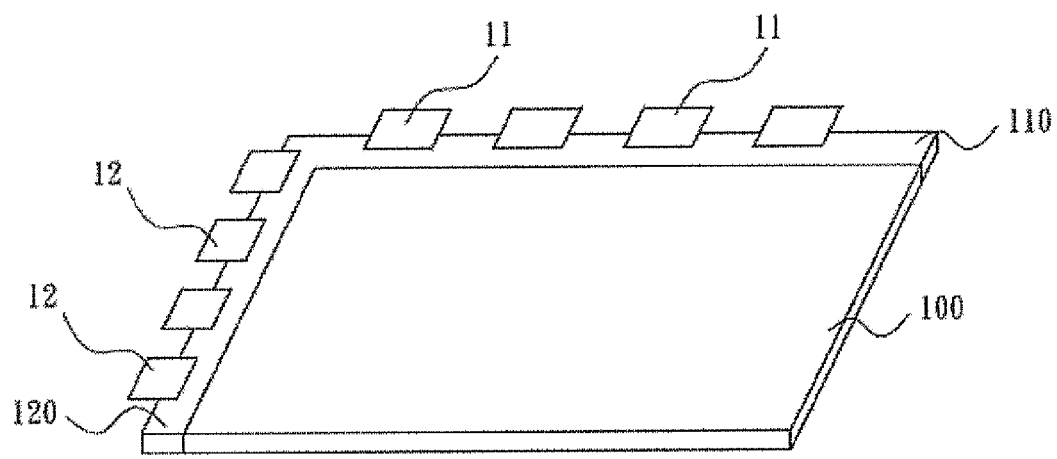

Lastly, as shown in FIG. 4H, the above-mentioned punching, moving and bonding steps can be repeated. In the preferred embodiment, because the numbers of the first COFs 11 and the second COFs 12 are the same, by repeating the above-mentioned punching, moving and bonding steps, the bonding operation of the other first COFs 11 and second COFs 12 onto the liquid crystal panel 100 is accomplished.

As described above, the COF tape 10 according to the first preferred embodiment of the present invention is a composite packaged COF tape 10, wherein the first COFs 11 and the second COFs 12 therein are arranged alternately on the base tape 10a; the first COFs 11 and the second COFs 12 are punched onto the moving platform 30 by the punching mechanism 20; and the first COFs 11 and the second COFs 12 are bonded onto the two side edges of the liquid crystal panel 100 by the first bonding head 41 and the second bonding head 42 respectively. Therefore, the present invention can save the purchase cost of the COF tapes and the cost of related equipment. That is to say, it can simultaneously process the bonding operations of the two types of COF by using only one COF tape and one set of equipment, thus lowering the cost and increasing the productivity.

However, in a cycle section of the COF tape 10, the numbers of the first COFs 11 and the second COFs 12 thereof correspond to the numbers of the first COFs 11 and the second COFs 12 needed on the liquid crystal panel 100. Therefore, when the numbers of the first COFs 11 and the second COFs 12 needed on the liquid crystal panel 100 are different, it is necessary to adjust the numbers of the first COFs 11 and the second COFs 12 on a cycle section of the COF tape 10, their arranging order and following punching-bonding processes.

Figure 5:
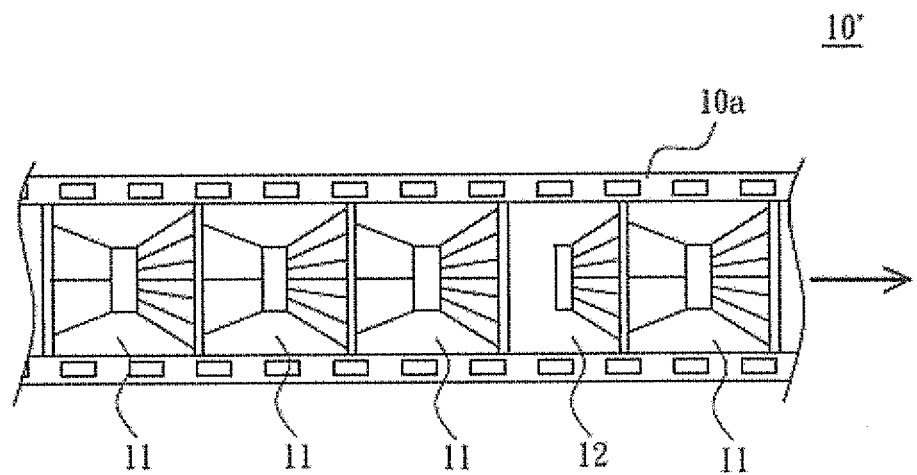
FIG. 5 is a top view of a composite packaged COF tape according to a second preferred embodiment of the present invention.

Referring now to FIG. 5, which is a top view of a composite packaged COF tape according to a second preferred embodiment of the present invention. The COF tape 10' of the second embodiment is similar to the COF tape 10 of the first embodiment, thus using similar terms and numerals to the foregoing embodiment, the difference of this embodiment being that: in the COF tape 10' of the second embodiment, the number of the first COFs 11 is greater than the number of the second COFs 12. For example, the number of the first COFs 11 is n+m; the number of the second COFs 12 is n. Therefore, there are two sections in a cycle section of the embodiment: in a first section, the numbers of the first COFs 11 and the second COFs 12 are the same, so that the first COFs 11 and the second COFs 12 are arranged alternately on the base tape 10a (such as in the first preferred embodiment of the present invention); but in a second section, there are only m of the first COFs 11 on the COF tape 10', that is, there are m of the first COFs 11 continually arranged on the COF tape 10' after last second COFs 12. Hence, the COF tape 10' of the second embodiment can insure that: in a cycle section thereof, the numbers of the first COFs 11 and the second COFs 12 exactly the same as the number of the first COFs 11 and the second COFs 12 needed on the liquid crystal panel 100'.

Figure 6A:
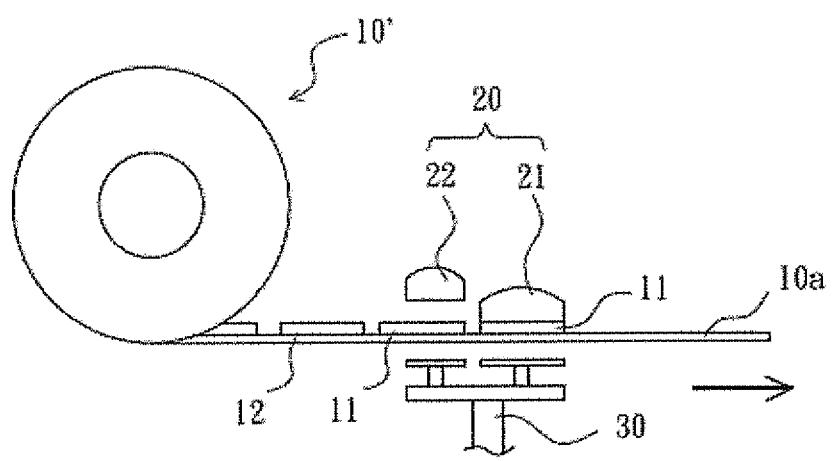
FIGS. 6A-6C are schematic views showing the steps in which the COF tape is bonded on a liquid crystal panel according to the second preferred embodiment of the present invention.
Figure 6B:
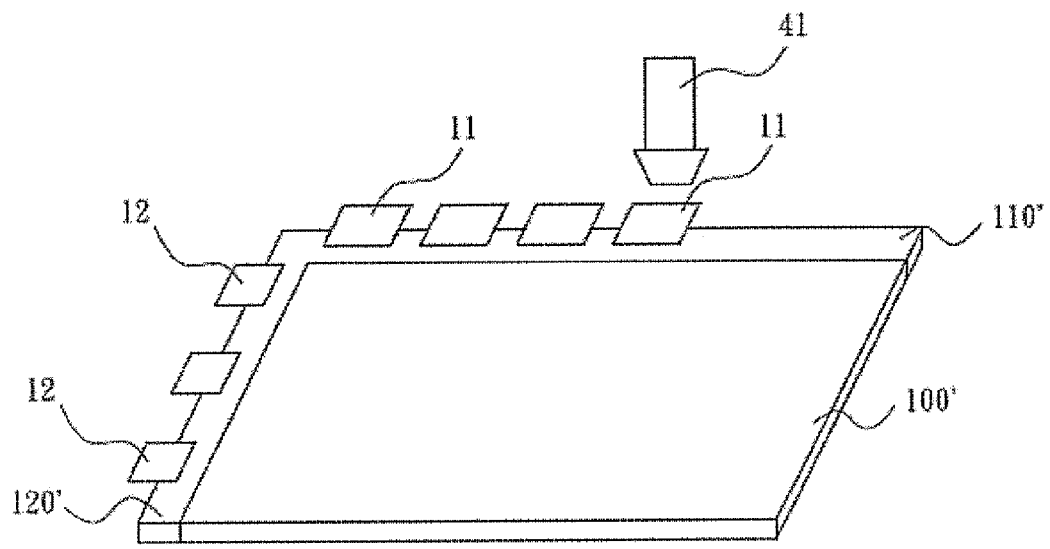
Figure 6C:
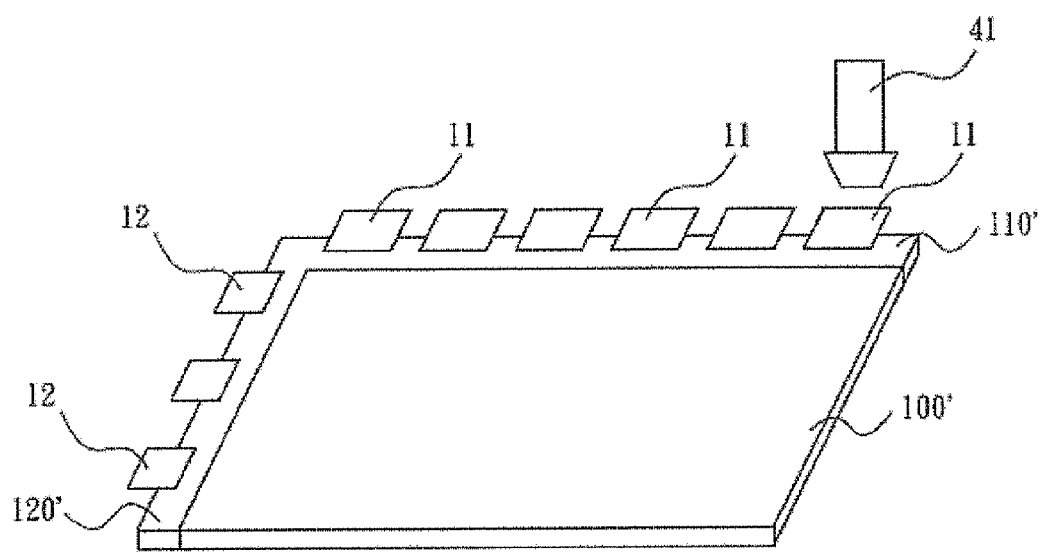

Referring now to FIGS. 6A-6C, which are schematic views showing the steps in which the COF tape 10' is bonded on a liquid crystal panel according to the second preferred embodiment of the present invention. The steps in which the COF tape 10 is bonded onto a liquid crystal panel according to the second preferred embodiment of the present invention can be divided in two stages: in the first stage, because the numbers of the first COFs 11 and the second COFs 12 are the same, the same steps as that of FIGS. 4A-4F are adopted; but when the first stage is finished, it is necessary to process a bonding for the rest the first COFs 11 alone.

As shown in FIG. 6A, the first punching head 21 punches the first COF 11 thereunder onto the moving platform 30. At this moment, it is unnecessary to consider the second punching head 22 as corresponding to any of the second COF 12, and it does not process a punching action. Then, the moving platform 30 is moved out to a certain position.

As shown in FIG. 6B, the first bonding head 41 picks up the first COF 11 on the moving platform 30, and bonds the first COF 11 onto the first side edge 110' of the liquid crystal panel 100'.

The above-mentioned punch-bonding steps can be repeated, until such time as the bonding operation of the first COFs 11 onto the first side edge 110' of the liquid crystal panel 100' is completed (as shown in FIG. 6).

The rule of how the first COFs 11 and the second COFs 12 are arranged on the COF tape 10 is not limited in the present invention. However, no matter what the arranging rule is, the corresponding punch-bonding steps are necessary. Moreover, if the interference between the first bonding head 41 and the second bonding head 42 on the moving platform 30 can be avoided, the first bonding head 41 and the second bonding head 42 can further take and bond the first COFs 11 and the second COFs 12 simultaneously.

That is to say, in the present invention, according to the situation in which the first COFs 11 and the second COFs 12 are arranged on the COF tape 10, 10', the first punching head 21 and the second punching head 22 of the punching mechanism 20 can actuate alone or together, and punch the first COFs 11 and/or the second COFs 12 onto the moving platform 30. According to the situation in which the first COFs 11 and the second COFs 12 are placed on the moving platform 30, the first bonding head 41 and the second bonding head 42 can actuate alone or together.

In another words, in the present invention, the first punching head 21 punches the corresponding first COFs 11 onto the moving platform 30 and/or the second punching head 22 punches the corresponding second COFs 12 onto the moving platform 30; and the first bonding head 41 picks up the corresponding first COFs 11 on the moving platform 30 to bond onto the corresponding first side edge 110 of the liquid crystal panel 100, and/or the second bonding head 42 picks up the corresponding second COFs 12 on the moving platform 30 to bond onto the corresponding second side edge 120 of the liquid crystal panel 100.

As described above, a single traditional COF tape only provides one type of COF. If two different types of COF need to be provided simultaneously, it is necessary to prepare two sets of independent operating equipment, thus increasing the cost of the equipment. In the present invention, by providing of a composite packaged COF tape 10 which comprises a plurality of first COFs 11 and a plurality of second COFs 12 arranged alternately on the base tape 10a, and by providing of a punching mechanism 20, a moving platform 30, and bonding heads 41 and 42, the first COFs 11 and the second COFs 12 are respectively bonded onto two side edges of a liquid crystal panel 100, and the action is repeated until the bonding operation of all of the first COFs 11 and the second COFs 12 of the liquid crystal panel 100 is completed. Therefore, the present invention can save the purchase cost of the COF tapes and the cost of related equipment, and it can simultaneously process the bonding operations of the two types of COF by using only one COF tape and one set of equipment, thus lowering the cost and increasing the productivity.

The present invention has been described with preferred embodiments thereof and it is understood that many changes and modifications to the described embodiments can be carried out without departing from the scope and the spirit of the invention that is intended to be limited only by the appended claims.

The invention claimed is:

1. A chip-on-film (COF) bonding method, comprising steps of:
providing a COF tape comprising a base tape, a plurality of first COFs and a plurality of second COFs, wherein the first COFs and the second COFs are arranged on the base tape, and then a part of the COF tape is pulled out;
providing a punching mechanism and a moving platform, wherein the punching mechanism comprises a first punching head and a second punching head which are disposed above the COF tape, and the moving platform is disposed under the corresponding COF tape, and the first punching head punches the corresponding first COFs onto the moving platform and/or the second punching head punches the corresponding second COFs onto the moving platform;
moving the moving platform out to a position;
providing a liquid crystal panel having a first side edge and a second side edge perpendicular to each other; and
providing a first bonding head and a second bonding head, wherein the first bonding head picks up the corresponding first COFs on the moving platform to bond onto the corresponding first side edge of the liquid crystal panel, and/or the second bonding head picks up the corresponding second COFs on the moving platform to bond onto the corresponding second side edge of the liquid crystal panel.

2. The COF bonding method according to claim 1, wherein the steps of punching and bonding are repeated, so as to accomplish bonding operations of all of the first COFs and the second COFs of the liquid crystal panel.

3. The COF bonding method according to claim 2, wherein in a cycle section of the COF tape, the number of the first COFs and the second COFs is correspond to the number of the first COFs and the second COFs needed on a liquid crystal panel.

4. The COF bonding method according to claim 3, wherein in the cycle section, the number of the first COFs is n+m, and the number of the second COFs is n; and wherein n of the first COFs and n of the second COFs are arranged in alternation firstly, and then m of the first COFs are arranged thereafter.

5. The COF bonding method according to claim 4, wherein according to an arranged situation of the first COFs and the second COFs on the COF tape, the first punching head and the second punching head actuate alone or together, so as to punch the first COFs and/or the second COFs onto the moving platform.

6. The COF bonding method according to claim 5, wherein according to a placed situation in which the first COFs and the second COFs are placed on the moving platform, the first bonding head and the second bonding head actuate alone or together, so as to bond the first COFs and/or the second COFs onto the liquid crystal panel.

7. A chip-on-film (COF) bonding method, comprising steps of:

providing a COF tape comprising a base tape, a plurality of first COFs and a plurality of second COFs, wherein the first COFs and the second COFs are arranged on the base tape, and in a cycle section of the COF tape, the number of the first COFs is n+m, and the number of the second COFs is n; and wherein n of the first COFs and n of the second COFs are arranged in alternation firstly, and then m of the first COFs are arranged thereafter; and then a part of the COF tape that n of the first COFs and n of the second COFs are arranged on is pulled out;

providing a punching mechanism and a moving platform, wherein the punching mechanism comprises a first punching head and a second punching head which are disposed above the COF tape, and the moving platform is disposed under the corresponding COF tape, and the first punching head punches the corresponding first COFs onto the moving platform and the second punching head punches the corresponding second COFs onto the moving platform;

moving the moving platform out to a position;

providing a liquid crystal panel having a first side edge and a second side edge perpendicular to each other; and providing a first bonding head and a second bonding head, wherein the first bonding head picks up the corresponding first COFs on the moving platform to bond onto the corresponding first side edge of the liquid crystal panel, and the second bonding head picks up the corresponding second COFs on the moving platform to bond onto the corresponding second side edge of the liquid crystal panel.

8. The COF bonding method according to claim 7, wherein the steps of claim 7 are repeated, so as to accomplish bonding operations of the part of the COF tape that n of the first COFs and n of the second COFs are arranged on.

9. The COF bonding method according to claim 8, wherein after the steps of claim 8, further comprising the following steps of:

pulling out the part of the COF tape that m of the first COFs are arranged on;

punching the corresponding first COFs onto the moving platform by the first punching head;

moving the moving platform out to a position; and picking up the corresponding first COFs on the moving platform by the first bonding head to bond onto the corresponding first side edge of the liquid crystal panel.

10. The COF bonding method according to claim 9, wherein the steps of claim 9 are repeated, so as to accomplish bonding operations of the part of the COF tape that m of the first COFs are arranged on.

* * * * *